United States Patent [19]

Adams

[11] Patent Number: 4,608,543
[45] Date of Patent: Aug. 26, 1986

[54] CONTROLLABLE EFFECTIVE RESISTANCE AND PHASE LOCK LOOP WITH CONTROLLABLE FILTER

[75] Inventor: Neil R. Adams, San Francisco, Calif.

[73] Assignee: Advanced Micro Devices, Inc., Sunnyvale, Calif.

[21] Appl. No.: 682,384

[22] Filed: Dec. 17, 1984

[51] Int. Cl.⁴ .......................... H03L 7/06; H03H 7/44
[52] U.S. Cl. .......................................... 331/8; 331/17; 331/132; 333/217
[58] Field of Search ...................... 331/8, 17, 115, 132; 333/172, 174, 217; 307/490, 495, 494, 520, 521; 328/167

[56] References Cited

U.S. PATENT DOCUMENTS 3,739,195  6/1973  Fidi et al. ............................. 307/490
3,965,441  6/1976  Roy et al. ......................... 333/217 X
4,433,308  2/1984  Hirata ....................... 331/DIG. 2 X

FOREIGN PATENT DOCUMENTS 0120314  7/1983  Japan ................................... 333/217

OTHER PUBLICATIONS

Surakampontorn, W., "Wide-Band Voltage Controlled and Current-Controlled Resistance Circuits", *Int. J. Electronics*, Feb. 1981, vol. 50, No. 2, pp. 149–152.

Primary Examiner—Eugene R. Laroche
Assistant Examiner—D. C. Mis
Attorney, Agent, or Firm—Patrick T. King; Mark A. Haynes; J. Vincent Tortolano

[57] ABSTRACT

Disclosed is a circuit providing a controllable effective resistance which comprises of transistor means that provides current at an input node responsive to an input voltage at the input node. The transistor means is coupled to a settable current source which operates to control the effective value of the controllable effective resistance. The invention also includes a filter which employs the controllable effective resistance to vary the breakpoint frequency of the filter. Also, a phase-locked loop apparatus employing the filter is disclosed.

16 Claims, 4 Drawing Figures

CONTROLLABLE EFFECTIVE RESISTANCE AND PHASE LOCK LOOP WITH CONTROLLABLE FILTER

FIELD OF THE INVENTION

The present invention relates generally to an apparatus having controllable effective resistance, and to a filter apparatus and a phase-locked loop apparatus employing the controllable effective resistance.

BACKGROUND OF THE INVENTION

Resistors are basic components of most electronic circuits. They are used for biasing, current limiting and a wide range of functions determined by the resistance of the resistor and the particular circuit in which they are used.

Filters are one type circuit employing resistors that are used extensively in the field of electrical signal processing. Fundamentally, the filter has a capacitor and a resistor whose values define frequency response of the filter. Thus, a different value for either the capacitor or the resistor will result in a change in the frequency response.

Typically for prior filters, the frequency response has been changed by substituting a capacitor of one value for a capacitor of another value or by changing a resistor of one value for a resistor of another value. Therefore, a given filter may not be easily used in two different applications requiring different frequency responses since it may be necessary to change either the capacitor or resistor, so that the filter may be usable in either application. Moreover, if the filter is implemented as an integrated circuit, it would not be possible to change the capacitor or resistor.

One application of a filter involves its use in a circuit known as a phase-locked loop. One overall function of a phase-locked loop is to receive an input signal and then output a frequency signal in dependence on any difference in phase between the input signal and the output signal. The phase-locked loop includes a phase detector which receives the input signal and the output signal to generate a phase error signal, the filter that filters the phase error signal and a voltage controlled oscillator that responds to the filtered phase error signal to output and feed back to the phase detector the output frequency signal. The filter will have a frequency response that is predetermined based on the data rate of the input signal that the phase-locked loop is processing.

One problem with a prior phase-locked loop, particularly one being implemented as an integrated circuit, is its inflexibility in being able to be used with different input signals having different data rates. This stems in part from the use of the filter and its fixed frequency response based on the set capacitor and resistor values of the filter.

As the above examples illustrate, the value of resistance of a resistor may have important effects on the operation of circuits employing the resistor.

SUMMARY OF THE INVENTION

In one aspect, the present invention is an apparatus having a controllable effective resistance, comprising a transistor means for providing a current at an input node responsive to an input voltage at the input node, coupled to a settable current source. The settable current source operates to control the effective value of the controllable effective resistance.

In another aspect, the invention is an apparatus for filtering a signal, comprising a filter having a controllable filter response that includes a charge storage device and an apparatus having a controllable effective resistance coupled to the charge storage device. The filter apparatus also includes a means for controlling the controllable effective resistance to set the filter response.

In yet another aspect, the present invention is an apparatus providing an output frequency signal in response to an input signal having a nominal data rate, comprising phase-locked loop means for generating the output signal in response to a difference in phase between the output frequency signal and the input signal, including a controllable filter having a frequency response in dependence on the nominal data rate of the input signal, and means for controlling the controllable filter to have the frequency response.

DETAILED DESCRIPTION

With reference to the Figures, a detailed description of the present invention is provided. First, the basic controllable effective resistance of the present invention is disclosed. Then, a filter apparatus employing the controllable effective resistance and a phase-locked loop apparatus employing the controllable effective resistance are described. Finally, a preferred embodiment of the controllable effective resistance for implementation as an itegrated circuit component is described.

I. Overview

Figure 1:
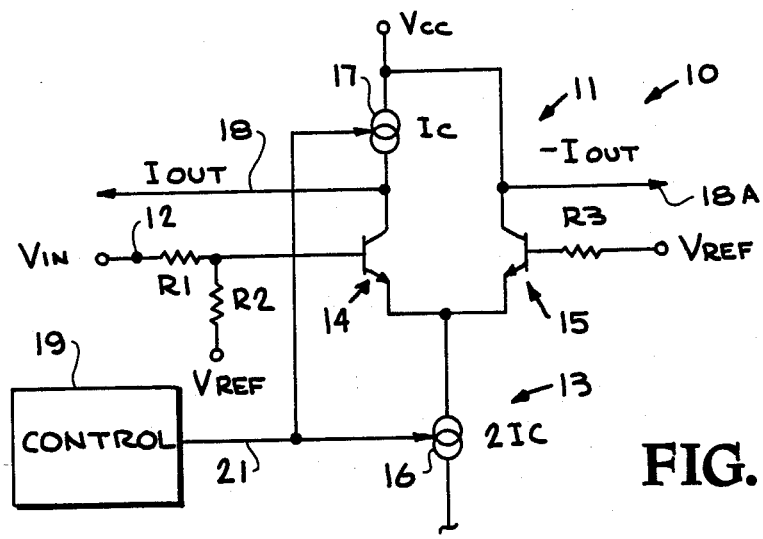
FIG. 1 is a schematic diagram of an apparatus according to the present invention.

FIG. 1 shows a schematic diagram of an apparatus 10 having a controllable effective resistance according to the present invention. The apparatus 10 includes a transistor means 11 for providing a current $I_{OUT}$ that is proportional to an input voltage $V_{IN}$ supplied at the input node 12 for small input voltages. A settable current source 13 is coupled to the transistor means 11. The settable current source 13 supplies variable current in response to a control signal generated by a control means 19. By varying the settable current source 13, the magnitude of the current $I_{OUT}$ is varied, thereby providing a controllable effective voltage to current conversion. By coupling the current $I_{OUT}$ on line 18 to the input node 12, the apparatus 10 behaves essentially as a resistor with controllable resistance.

The transistor means 11 in the embodiment of FIG. 1 includes a differential pair of transistors 14, 15. The base of transistor 14 is coupled to the input node 12 across resistor R1. Also the base of transistor 14 is coupled to a reference voltage $V_{REF}$ across resistor R2.

The base of transistor 15 is coupled to the reference voltage $V_{REF}$ across resistor R3.

In the embodiment shown, the settable current source 13 includes a first variable current source 16 and a second variable current source 17. In the embodiment shown, the first variable current source 16 supplies a current $2I_C$ which is twice the current $I_C$ of the second variable current source 17. The second variable current source 17 supplies a balancing current to the apparatus 10 so that it can behave as a classical resistor as discussed below, and can be varied or eliminated in some applications.

The emitters of the differential pair of transistors 14, 15 are coupled to the first variable current source 16. The collector of one transistor 14 of the differential pair of transistors 14, 15 is coupled to the second variable current source 17.

In operation, the controllable effective resistance 10 shown in FIG. 1 supplies a current on line 18 which is proportional to the voltage difference between the input voltage $V_{IN}$ and the reference voltage $V_{REF}$ for small values of $V_{IN}$.

If there is zero difference in voltage between $V_{IN}$ and $V_{REF}$, the output current $I_{OUT}$ on line 18 is zero. This is so because the second variable current source 17 supplies current $I_C$ through the collector of the one transistor 14 which satisfies the balance condition of the differential pair 14, 15. So $I_{OUT}$ must be zero. The other transistor 15 will conduct an equal current $I_C$ through its collector to satisfy the second variable current source 16.

As the input voltage $V_{IN}$ increases, the current conducted through the collector of the one transistor 14 likewise increases at the expense of the other transistor 15, since the sum of the currents through the differential pair of transistors 14, 15 is forced to be $2I_C$ by the first variable current source 16. An output current $I_{OUT}$ is equal to the difference of the collector current of transistor 14 and the current $I_C$ from the second variable current source 17.

For the opposite relationship, as the input voltage $V_{IN}$ falls below the reference voltage $V_{REF}$, the current conducted by the other transistor 15 will be greater than that conducted by the one transistor 14. Thus an output current $I_{OUT}$ will flow out of line 18 which subtracts current from the collector of the one transistor 14 in order to maintain the sum of the currents through the differential pair of transistors 14, 15 at the value $2I_C$ of the first variable current source 16.

The effective resistance of the apparatus 10 having a controllable effective resistance of FIG. 1 can be calculated in simplified form. By definition, the effective resistance $R_{EFF}$ is determined by the following equation (1):

$$R_{EFF} = \frac{(V_{IN} - V_{REF})}{I_{OUT}} \quad (1)$$

The output current $I_{OUT}$ on line 18 is derived by the following equation (2):

$$I_{OUT} = I_C(V_{IN} - V_{REF})F \quad (2)$$

where F is equal to a constant for small values of $(V_{IN} - V_{REF})$ determined by the characteristics of the differential pair of transistors 14, 15.

By combining equation (1) with equation (2), it is determined that the effective resistance $R_{EFF}$ is defined by the following equation (3):

$$R_{EFF} = \frac{1}{I_C F} \quad (3)$$

Accordingly, the apparatus 10 has a controllable effective resistance that is controllable in response to the settable current source 13. By varying the current supplied by the settable current source 13, the effective resistance $R_{EFF}$ of the apparatus 10 is likewise controlled.

An additional feature of the present invention can be seen at line 18A in FIG. 1. By taking the output current $I_{OUT}$ from the collector of the other transistor 15 of the differential pair of transistors, the apparatus 10 behaves as a negative controllable effective resistance. By connecting the line 18A to the input node 12, a negative resistance is obtained which is controllable by selecting the value of the current source means 13. The output currents on line 18 and on line 18A normally will not be generated in a single apparatus 10.

The settable current source 13 receives a control signal on a control line 21 from a control means 19 for controlling the settable current source 13. The control means 19 may include current mirrors or other current scaling apparatus which provide a control signal on line 21 for controlling the settable current source 13. The operation of the control means 19 to generate the control signal on control line 21 can be varied in accordance with the particular application of the apparatus 10. For instance, for apparatus 10 having a controllable effective resistance employed in a RC filter, the control means 19 may supply a control signal on control line 21 which is proportional to the desired breakpoint frequency $f_B$ of the RC filter. Other relationships between the control means 19 and the apparatus 10 will be determined by the particular application of the apparatus 10 having a controllable effective resistance.

II. A Filter Employing the Controllable Effective Resistance

Figure 2:
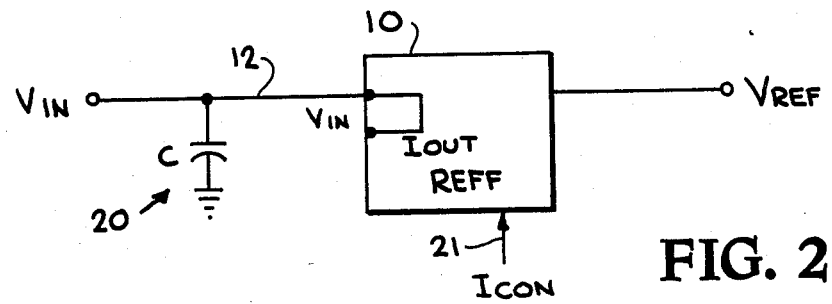
FIG. 2 is a block diagram of a controlled filter according to the present invention.

FIG. 2 is a block diagram of a filter apparatus 20 employing the apparatus 10 having a controllable effective resistance. The filter apparatus 20 includes a charge storage means for storing charge, such as capacitor C, coupled across the input node 12 of the apparatus 10 to a ground terminal. As discussed above, the apparatus 10 provides an output current $I_{OUT}$ which is proportional to the voltage $(V_{IN} - V_{REF})$. The value of the controllable effective resistance is determined by the control signal on line 21 which controls the setting of the settable current source 13 in FIG. 1. The filter apparatus 20 provides a filter having a settable frequency response because of the manner in which the controllable effective resistance of apparatus 10 is employed. The following simplified equations prove the relationship.

The breakpoint frequency $f_B$ of the filter apparatus 20 is given by the following equation (4):

$$f_B = \frac{1}{2\pi R_{EFF} C} \quad (4)$$

Thus by changing $R_{EFF}$, the breakpoint frequency of the filter apparatus is changed. If you substitute the equation (3) for $R_{EFF}$ in equation (4), the following equation (5) is obtained:

$$f_B = \frac{2I_C F}{2\pi C} \quad (5)$$

Thus by varying the current $2I_C$, $I_C$ supplied by the settable current source 13, the breakpoint frequency $f_B$ of the filter apparatus 20 of FIG. 2 can be changed.

The control signal on line 21 is of a character for controlling the settable current source 13 of the controllable effective resistance 10. As mentioned above, the settable current source 13 can be manufactured in a variety of embodiments including digital or analog versions which are responsive to a control signal. For the RC filter apparatus 20, the control signal sets the current source 13 to provide a current $I_C$ which results in the desired effective resistance $R_{EFF}$ for the given capacitance of the charge storage device C to obtain the desired breakpoint frequency $f_B$ in accordance with equations 4 and 5.

The filter apparatus 20 in the preferred embodiment is formed on a semiconductor wafer in an integrated circuit. Because of the inability to vary charge storage devices in integrated circuits easily, the filter apparatus 20 employing the apparatus 10 having a controllable effective resistance has particular utility.

III. Phase Lock Loop Apparatus

Figure 3:
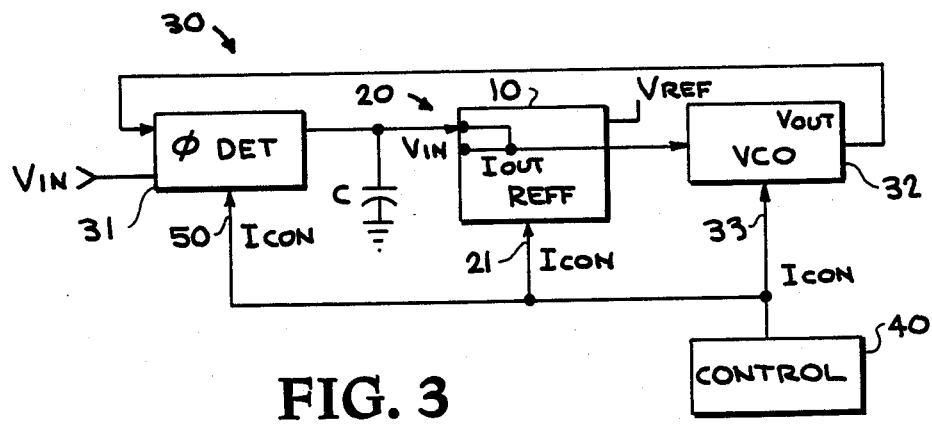
FIG. 3 is a block diagram of a phase-locked loop apparatus according to the present invention.

FIG. 3 illustrates a block diagram of a phase-locked loop apparatus 30 employing the apparatus 10 having a controllable effective resistance. The phase-locked loop apparatus 30 includes a phase detector 31, a filter apparatus 20, and a voltage controlled oscillator 32. The phase detector 31 compares a difference in phase between an input signal $V_{IN}$ having a given frequency, or nominal data rate, with the output frequency signal $V_{OUT}$ from the voltage control oscillator 32 having a settable frequency. The output of the phase detector 31 is a signal proportional to the difference in phase between $V_{IN}$ and $V_{OUT}$. The output of the phase detector 31 is filtered by the controllable filter apparatus 20 and supplied as input to the voltage controlled oscillator 32. The frequency of the voltage controlled oscillator is shifted in response to the output from the controllable filter apparatus 20 in order to track the input signal $V_{IN}$.

The voltage controlled oscillator 32 operates at a center frequency in response to a control signal $I_{CON}$ on line 33. The filter apparatus 20 and the phase detector 31 are set to operate with a breakpoint frequency $f_B$ that is proportional to the frequency of operation of the voltage controlled oscillator 32. Accordingly, the control signal $I_{CON}$ on line 33, the control signal $I_{CON}$ on line 21 for controlling the effective resistance of the controllable effective resistance 20, and the control signal $I_{CON}$ on line 50 for centering the phase detector 31 are generated in conjunction in control means 40 for generating the control signal in dependence on the nominal data rate of $V_{IN}$ to provide a phase-locked loop apparatus 30 which operates over a wide range of center frequencies.

IV. A Preferred Embodiment of the Controllable Effective Resistance

Figure 4:
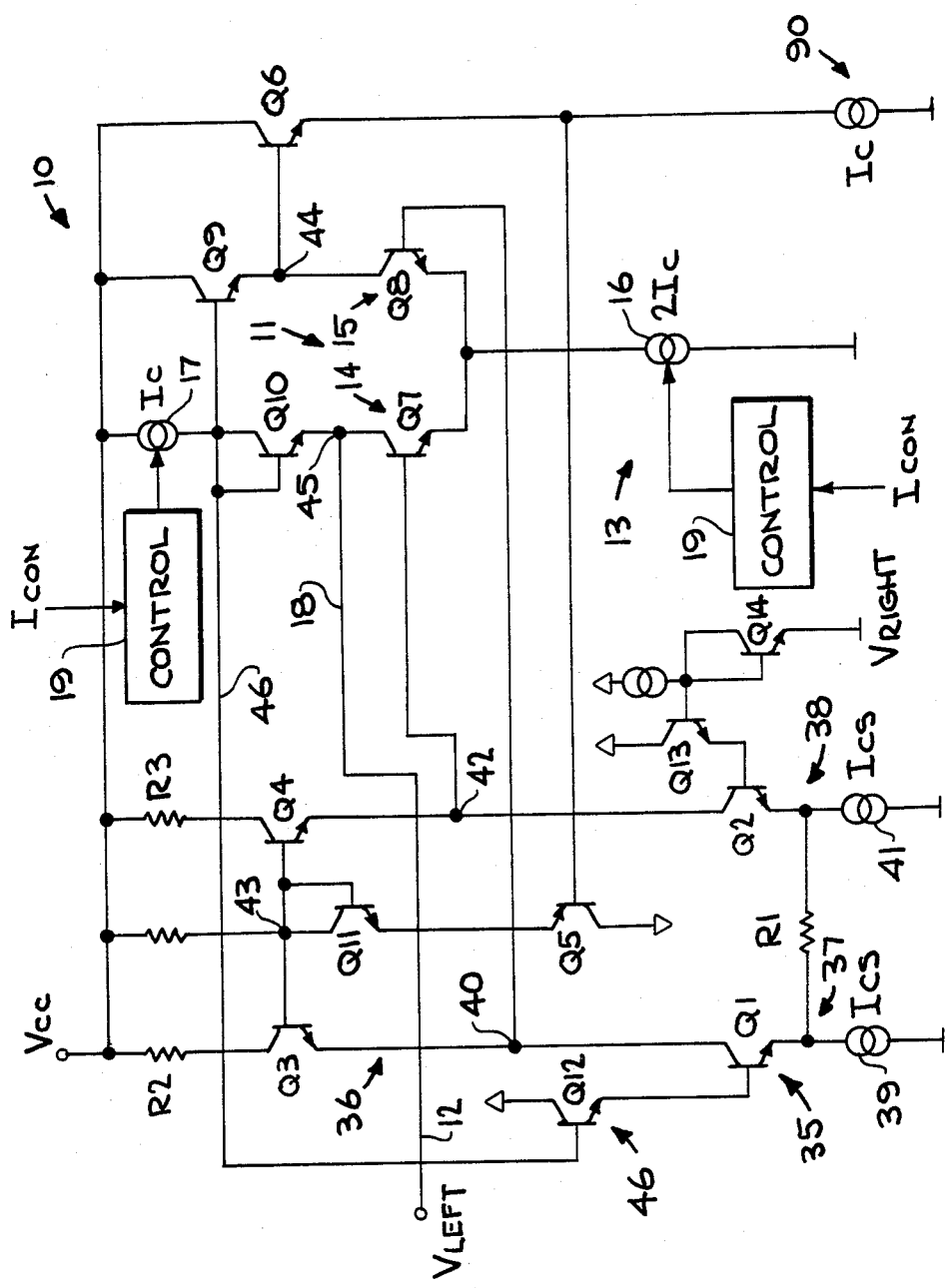
FIG. 4 is a more detailed schematic diagram of a preferred embodiment of an apparatus having a controllable effective resistance.

FIG. 4 illustrates a circuit diagram of a preferred embodiment for the present invention for implementation on an integrated circuit chip. The reference numbers from FIG. 1 are used in FIG. 4 where appropriate for consistency.

As in FIG. 1, the transistor means 11 is comprised of a differential pair of transistors 14, 15. Transistor Q7 corresponds to the one transistor 14 of FIG. 1 and transistor Q8 corresponds to the other transistor 15 of FIG. 1.

The settable current source 13 is comprised of a first variable current source 16 and a second variable current source 17. The first variable current source 16 supplies $2I_C$ current at the emitters of the differential pair of transistors Q7, Q8. The first variable current source 16 and second variable current source 17 are set to a desired current level by control 19. The control 19 is implemented with settable current mirrors or other control circuitry as suits the user.

The second variable current source 17 supplies current through the diode means Q10 to the collector of the one transistor Q7. The output current $I_{OUT}$ is supplied over line 18 from the collector of transistor Q7 to the input node 12.

The apparatus 10 having a controllable effective resistance of the embodiment shown in FIG. 4 provides an effective resistance $R_{EFF}$ across a differential input voltage ($V_{LEFT}$-$V_{RIGHT}$).

A means 35 for providing overall temperature compensation is provided. Also, a means 36 for maintaining appropriate bias voltages at the bases of the differential pair of transistors Q7, Q8 is provided.

The means 35 for providing temperature compensation includes a first current path 37 and a second current path 38. The first current path 37 includes a current source 39 supplying current to the emitter of a transistor Q1. The collector of the transistor Q1 is connected to a node 40 which is connected to the base of the transistor Q8 of the transistor means 11. Another transistor Q3 is connected at its emitter to the node 40. The collector of the transistor Q3 is connected through resistor R2 to the supply voltage $V_{CC}$.

The second current path 38 likewise includes a current source 41 supplying current to the emitter of a transistor Q2. The collector of the transistor Q2 is connected to a node 42 which is coupled to the base of the transistor Q7 of the transistor means 11. Another transistor Q4 is coupled at its emitter to the node 42. The collector of transistor Q4 is coupled across resistor R3 to the supply voltage $V_{CC}$.

The emitters of the transistor Q1 of the first current path 37 and Q2 of the second current path 38 are coupled together across resistor R1.

The base of the transistor Q1 of the first current path 37 is coupled to the voltage $V_{LEFT}$ at input node 12 across the emitter follower transistor Q12 over line 46 across diode means Q10. The base of transistor Q2 of the second current path 38 is coupled to the voltage $V_{RIGHT}$ across the emitter follower Q13 and diode means Q14 which matches diode means Q10.

The voltage node 42 follows the voltage $V_{LEFT}$ at node 12. Likewise, the voltage at node 40 follows the voltage $V_{RIGHT}$. This occurs because the differential voltage $V_{LEFT}-V_{RIGHT}$ will cause a current to flow across the resistor R1.

For example, if $V_{LEFT}$ is at a higher voltage than $V_{RIGHT}$, then the current through transistor Q2 will be less than the current through transistor Q1. However, because the current sources 39, 41 draw equal current, a current must flow through R1 to the emitter of Q2 to balance the current. Because there is less current flowing through the collector of Q2 than flowing through the collector of Q1, the voltage drop from the base to emitter of transistor Q4 will be less than the voltage drop from the base to emitter of transistor Q3. Thus, the voltage at node 42 will be higher than the voltage at node 40. The same explanation applies for the opposite relationship.

Temperature compensation is provided by manufacturing transistor Q3 and Q4 to match transistors Q7 and Q8 of the transistor means 11 as closely as possible. Because a change in temperature will effect transistors Q3 and Q4 the same way as it will effect transistors Q7 and Q8, the voltages at nodes 40 and 42 applied to the bases of the differential pair of transistors Q7, Q8 will track the changes in the impedance of the base to emitter junction of the transistors Q7 and Q8 as the temperature changes.

In some environments, particularly for most integrated circuits, the range of bias voltages available is limited due to low supply voltages. The present invention overcomes that limitation by including the means 36 for providing bias voltages.

The means 36 for providing bias voltages for the transistor means 11 includes transistors Q5, Q6, Q9, Q10 and Q11. In order to maintain the transistor means 11 in its desired operating range without saturating the transistors in the means 35 for providing temperature compensation, the means 36 provides bias voltages to the transistor means 11 within the constraints of the integrated circuit environment.

The means 36 comprises a voltage path as follows. The voltage at node 45 at the collector of the one transistor Q7 and the voltage at node 44 at the collector of the other transistor Q8 are held roughly equivalent through the diode connected transistor Q10 and down through the emitter of transistor Q9, which is connected to the node 44. The node at the emitter of the transistor Q6 is $1V_{BE}$ below the voltage at the node 44. The voltage drop at the emitter of the transistor Q6 is made to track the voltage drops through the emitters of the transistors Q10 and Q9 by the controllable current source 90, which is controlled to deliver a current which is equal to about $I_C$. The voltage at the emitter of the transistor Q6 is supplied to the base of the pnp transistor Q5. The voltage at the emitter of the transistor Q5 is thus approximately equal to the voltage at the node 44. The diode connected transistor Q11 maintains the voltage at the node 43 approximately $1V_{BE}$ above the voltage at the node 44 and at the node 45. This circuit path assures that the voltage at the nodes 40 and 42 at the bases of the one transistor Q7 and the other transistor Q8 of the differential pair of transistors are maintained within an acceptable range of the voltages of the collectors of the one transistor Q7 and the other transistor Q8.

The circuit shown in FIG. 4 illustrates a further feature of the preferred embodiment in that a means 46 for minimizing base current leakage through the apparatus 10 having a controllable effective resistance is provided. The means 46 is embodied by the emitter follower transistors Q12 and Q13 which provide additional gain at the input of the means 35 for providing temperature compensation. At very high values of effective resistance $R_{EFF}$ for the controllable effective resistance 10, the current flowing through the base of the temperature compensation circuit transistors Q1 and Q2 becomes significant. Accordingly, the emitter follower transistors Q12 and Q13 are provided to minimize the base current leakage while providing sufficient drive for the apparatus 10 having a controllable effective resistance.

The variable current sources, including the first variable current source 16, the second variable current source 17 and the variable current source 90 in the circuit shown in FIG. 4 are preferably implemented by current mirrors that are adapted to provide a current that is a multiple of the control signal $I_{CON}$. The current mirrors are scaled in the control 19 to provide the correct multiples of the control signal $I_{CON}$. When implemented in a phase-locked loop apparatus, the control signal $I_{CON}$, which is used to center the VCO, can be scaled in the control 19 to provide proper currents for the controllable effective resistance 10. As the center frequency of the VCO changes, the control signal $I_{CON}$ will change accordingly. As $I_{CON}$ changes, the effective value of the controllable effective resistance 10 will also change so that the bandwidth of the filter 20 in the phase-locked loop apparatus 30 will automatically adjust to the center frequency of the VCO 32.

V. Conclusion

Thus, the present invention provides an apparatus 10 having a controllable effective resistance with a wide range of applications. The apparatus 10 can be used in the filter apparatus 20 in the present invention to provide a filter having a controllable frequency response over a wide range. Further the invention provides a phase-locked loop apparatus which is operable over a wide range of frequency.

The controllable effective resistance is controllable by varying a settable current source 13. Thus, the controllable effective resistance can be controlled to dynamically change the effective resistance $R_{EFF}$ of the apparatus in response to electronic signals.

The foregoing description of the invention has been presented for purposes of illustration and description. It is not intended to be exhaustive or to limit the invention to the precise form disclosed. And, obviously, many modifications and variations are possible in light of the above teaching. The filter and integrated circuit embodiments of the controllable effective resistance were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. An apparatus comprising:
a differential pair of transistors, one of said transistors being base biased in response to an input voltage and the other of said transistors being base biased in response to a reference voltage, said differential pair of transistors providing an output current at an output node of said differential pair of transistors which is proportional to the difference between said reference voltage and said input voltage, said input voltage being supplied to an input node of said differential pair of transistors, the constant of proportionality being determinable by a selectable current source means;
said current source means comprising a first variable current source means, responsive to a control signal, for providing a first settable current at the collector of said one transistor and a second variable current source means, responsive to the control signal, for providing a second settable current at the emitters of said differential pair of transistors, both first and second said settable currents acting in conjunction to affect the magnitude of the output current; and control means for supplying the control signal to said first and second variable current source means.

2. The apparatus of claim 1, further including:

means for minimizing base current leakage through said differential pair of transistors.

3. An apparatus having a controllable effective resistance, comprising:

current source means, responsive to a control signal, for providing a settable current;

transistor means coupled to said current source means for providing current at an input node proportional to the difference between an input voltage supplied at said input node and a reference voltage, to thereby provide an effective resistance, the value of said effective resistance being determinable by the settable current;

control means for providing the control signal to said current source means for setting the settable current; and means for minimizing base current leakage through said transistor means.

4. The apparatus of claim 3, further comprising:

means for biasing said transistor means within a operating range.

5. The apparatus of claim 3, wherein:

said transistor means provides an output current proportional to the negative of the input voltage at the input node, whereby the apparatus has a negative controllable effective resistance.

6. An apparatus having a controllable effective resistance formed on a semiconductor wafer, comprising:

a differential pair of transistors, one of said transistors being base biased in response to an input voltage into an input node, the other of said transistors being base biased in response to a reference voltage;

a first variable current source means, responsive to a control signal, for providing a first settable current at the collector of said one transistor;

a second variable current source means, responsive to the control signal, for providing a second settable current at the emitters of said differential pair of transistors;

control means for supplying the control signal to said first and second variable current source means; and means coupling the collector of said one transistor to the input node.

7. The apparatus of claim 6, further comprising:

means for providing temperature compensation for said transistor means.

8. The apparatus of claim 6, further comprising:

means for minimizing base current leakage through said transistor means.

9. The apparatus of claim 6, further comprising:

means for biasing said transistor means within a operating range.

10. The apparatus of claim 6, wherein:

said apparatus provides an output current proportional to the negative of the difference between the input voltage at the input node and the reference voltage, whereby the apparatus has a negative controllable effective resistance.

11. Apparatus for filtering a signal, comprising:

(a) a frequency having a controllable filter response, including
  (i) a charge storage device, and
  (ii) a controllable effective resistance coupled to said charge storage device; and (b) means for controlling said controllable effective resistance to set the filter response.

12. Apparatus, according to claim 11, wherein said controllable effective resistance comprises:

(a) a pair of differential transistors, one of said transistors being base biased in response to a first voltage of said charge storage device, and the other of said transistors being base biased in response to a second reference voltage; and (b) at least one settable current source coupled to said pair of transistor and to said controlling means.

13. Apparatus for providing an output frequency signal in response to an input signal having a nominal data rate, comprising:

(a) phase-locked loop means for generating the output frequency signal in response to a difference in phase between the output frequency signal and the input signal, including a controllable filter having a frequency response based on the nominal data rate of the input signal; and (b) control means for controlling said controllable filter frequency response.

14. The apparatus of claim 13, wherein said controllable filter comprises an apparatus having a controllable effective resistance.

15. The apparatus of claim 14, wherein said apparatus having a controllable effective resistance comprises a settable current source and a transistor coupled to said settable current source, said controlling means setting said settable current source.

16. The apparatus of claim 13, wherein said control means generates a control signal having a value in dependence on the nominal data rate, the control signal controlling said controllable filter.

* * * * *